(12) United States Patent
Reese et al.

(10) Patent No.: US 6,970,024 B1
(45) Date of Patent: Nov. 29, 2005

(54) OVER-VOLTAGE PROTECTION OF INTEGRATED CIRCUIT I/O PINS

(75) Inventors: Dirk Reese, Campbell, CA (US);
Tzung-Chin Chang, San Jose, CA (US); Chiakang Sung, Milpitas, CA (US); Khai Nguyen, San Jose, CA (US); Gopinath Rangan, Milpitas, CA (US); Xiaobao Wang, Santa Clara, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 10/786,370

(22) Filed: Feb. 24, 2004

(51) Int. Cl.[7] .............................................. H03K 3/01
(52) U.S. Cl. ..................................... 327/112; 327/534
(58) Field of Search ........................ 327/108, 111, 112, 327/530, 534, 535

(56) References Cited

U.S. PATENT DOCUMENTS

| | | | | |
|---|---|---|---|---|
| 5,422,591 A | * | 6/1995 | Rastegar et al. ............ | 327/409 |
| 6,040,729 A | * | 3/2000 | Sanchez et al. ............. | 327/309 |
| 6,140,846 A | * | 10/2000 | Chan et al. .................. | 327/108 |
| 6,404,269 B1 | * | 6/2002 | Voldman ...................... | 327/534 |
| 6,518,818 B1 | * | 2/2003 | Hynes .......................... | 327/333 |
| 6,765,430 B2 | * | 7/2004 | Ando ........................... | 327/534 |

* cited by examiner

*Primary Examiner*—Jeffrey Zweizig
(74) *Attorney, Agent, or Firm*—Townsend and Townsend and Crew LLP; J. Matthew Zigmant (57) ABSTRACT

Circuits, methods, and apparatus for protecting devices in an output stage from over-voltage conditions caused by high supply and input voltages. Embodiments provide over-voltage protection that operates over a range of voltage levels, and that can be optimized for performance at different voltage levels. An exemplary embodiment of the present invention uses stacked devices to protect n and p-channel output devices from excess supply and input voltages. These stacked devices are biased by voltages received at their gates. These gate voltages vary as a function of supply voltage to maintain performance. Other embodiments of the present invention provide a body bias switch that generates a bias for the bulk of p-channel output devices. This bias tracks the higher of a supply or input voltage, such that parasitic drain-to-bulk diodes do not conduct. A switch may be provided that shorts the bulk connection to VCC under appropriate conditions.

21 Claims, 10 Drawing Sheets

OVER-VOLTAGE PROTECTION OF INTEGRATED CIRCUIT I/O PINS

BACKGROUND

The present invention relates generally to input/output circuits, and more specifically to the protection of output circuits from over-voltage conditions.

In order to save power, the trend in integrated circuits has been to reduce their operating voltages. This reduction in power supply voltages has also been necessitated by the lower drain-to-source voltage of new, smaller geometry devices. For example, many circuits now operate at 1.5 or 1.8 volts, and the expectation is that these voltages will continue to be reduced in the future.

Not all integrated circuits operate at these lower voltages however. That is, many devices have been designed to operate at 2.5, 3.3 volts, or at even higher voltages. This means that some chips operating at the lower 1.5 or 1.8 volts should have outputs that are able to drive voltages in the higher supply range, and that they need to accept higher input voltages. For example, a device operating with core or internal voltage supplies of 1.5 volts and ground may need to send and receive signals that switch between 3.3 volts and ground.

This arrangement leads to several possible over-voltage problems for output drivers. For example, when an I/O cell is configured as an output and the supply voltage exceeds the drain-to-source breakdown voltage of the output driving devices, the output devices breakdown resulting in excessive currents. Also, when an I/O cell is configured as an input (or as a tri-stated output coupled to a tri-state bus) and the input voltage exceeds the supply voltage by more than a diode drop, the parasitic drain-to-bulk diode of a p-channel output device begins to conduct current, if the bulk is tied to the supply voltage. Further, in the receive mode, if the received voltage exceeds the drain-to-source breakdown voltage of an n-channel pull down device, that device may begin to conduct excess currents.

Thus what is needed are circuits, methods, and apparatus for protecting the devices in an output stage from over-voltage conditions such including those from excessive supply and received input voltages.

SUMMARY

Accordingly, embodiments of the present invention provide circuits, methods, and apparatus for protecting devices in an output stage from over-voltage conditions caused by high supply and input voltages. Embodiments provide over-voltage protection that operates over a range of voltage levels, and that can be optimized for performance at different voltage levels. An exemplary embodiment of the present invention uses stacked devices to protect n and p-channel devices from excess supply and input voltages. These stacked devices are biased by voltages received at their gates. These gate voltages vary as a function of supply voltage in order to improve drive voltages for output driving devices. Other embodiments of the present invention provide a body bias switch that provides a bias for the bulk of the p-channel output devices. This bias voltage tracks the higher of the supply or input voltage, such that parasitic drain-to-bulk diodes do not conduct currents. A switch may be provided that shorts the bulk connection to VCC under appropriate conditions. Various embodiments of the present invention may combine one or more of these or other features described below.

A better understanding of the nature and advantages of the present invention may be gained with reference to the following detailed description and the accompanying drawings.

DESCRIPTION OF EXEMPLARY EMBODIMENTS

Figure 1:
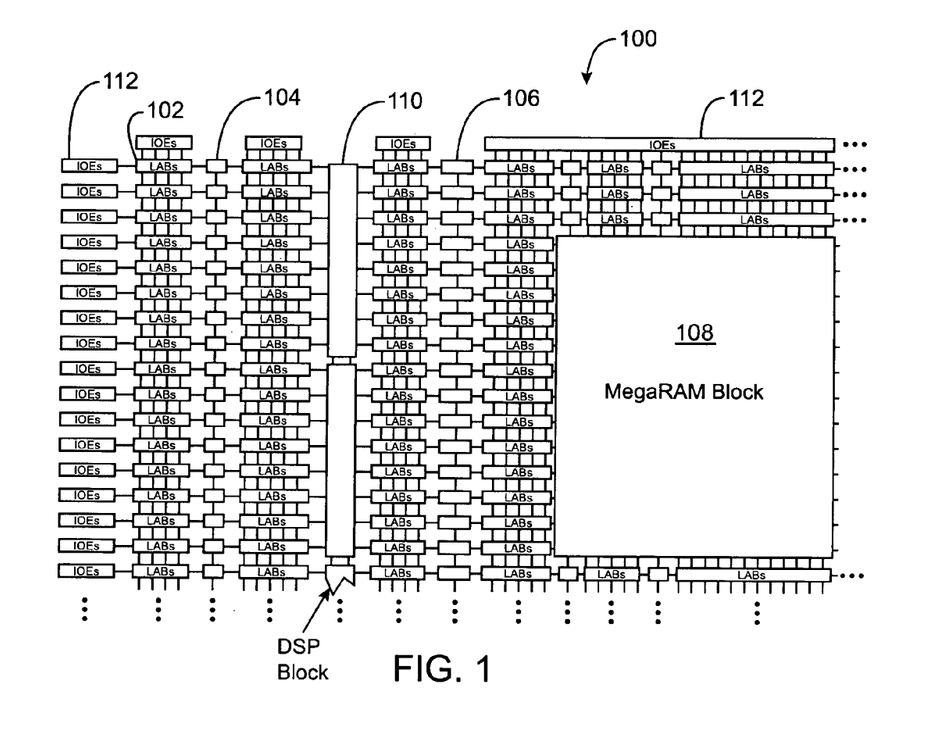
FIG. 1 is a simplified block diagram of a programmable logic device that may benefit by the incorporation of embodiments of the present invention.

FIG. 1 is a simplified partial block diagram of an exemplary high-density programmable logic device 100 wherein techniques according to the present invention can be utilized. PLD 100 includes a two-dimensional array of programmable logic array blocks (or LABs) 102 that are interconnected by a network of column and row interconnects of varying length and speed. LABs 102 include multiple (e.g., 10) logic elements (or LEs), an LE being a small unit of logic that provides for efficient implementation of user defined logic functions.

PLD 100 also includes a distributed memory structure including RAM blocks of varying sizes provided throughout the array. The RAM blocks include, for example, 512 bit blocks 104, 4K blocks 106 and a M-Block 108 providing 512K bits of RAM. These memory blocks may also include shift registers and FIFO buffers. PLD 100 further includes digital signal processing (DSP) blocks 110 that can implement, for example, multipliers with add or subtract features.

I/O elements (IOEs) 112 located, in this example, around the periphery of the device support numerous single-ended and differential I/O standards. These I/O elements may particularly benefit by incorporation of embodiments of the present invention, for example, where the LES and other core or internal circuits operate at a lower voltage than external circuits connected to the I/O elements.

It is to be understood that PLD 100 is described herein for illustrative purposes only and that the present invention can be implemented in many different types of PLDs, FPGAs, and the other types of digital integrated circuits.

Figure 2:
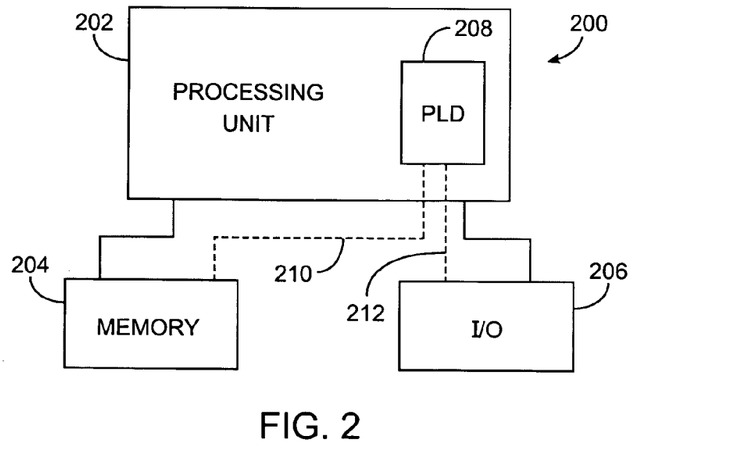
FIG. 2 is a block diagram of an electronic system that may benefit by the incorporation of embodiments of the present invention.

While PLDs of the type shown in FIG. 1 provide many of the resources required to implement system level solutions, the present invention can also benefit systems wherein a PLD is one of several components. FIG. 2 shows a block diagram of an exemplary digital system 200, within which the present invention may be embodied. System 200 can be a programmed digital computer system, digital signal processing system, specialized digital switching network, or other processing system. Moreover, such systems may be designed for a wide variety of applications such as telecommunications systems, automotive systems, control systems, consumer electronics, personal computers, Internet communications and networking, and others. Further, system 200 may be provided on a single board, on multiple boards, or within multiple enclosures.

System 200 includes a processing unit 202, a memory unit 204 and an I/O unit 206 interconnected together by one or more buses. According to this exemplary embodiment, a programmable logic device (PLD) 208 is embedded in processing unit 202. PLD 208 may serve many different purposes within the system in FIG. 2. PLD 208 can, for example, be a logical building block of processing unit 202, supporting its internal and external operations. PLD 208 is programmed to implement the logical functions necessary to carry on its particular role in system operation. PLD 208 may be specially coupled to memory 204 through connection 210 and to I/O unit 206 through connection 212.

Processing unit 202 may direct data to an appropriate system component for processing or storage, execute a program stored in memory 204 or receive and transmit data via I/O unit 206, or other similar function. Processing unit 202 can be a central processing unit (CPU), microprocessor, floating point coprocessor, graphics coprocessor, hardware controller, microcontroller, programmable logic device programmed for use as a controller, network controller, and the like. Furthermore, in many embodiments, there is often no need for a CPU.

For example, instead of a CPU, one or more PLD 208 can control the logical operations of the system. In an embodiment, PLD 208 acts as a reconfigurable processor, which can be reprogrammed as needed to handle a particular computing task. Alternately, programmable logic device 208 may itself include an embedded microprocessor. Memory unit 204 may be a random access memory (RAM), read only memory (ROM), fixed or flexible disk media, PC Card flash disk memory, tape, or any other storage means, or any combination of these storage means.

Figure 3:
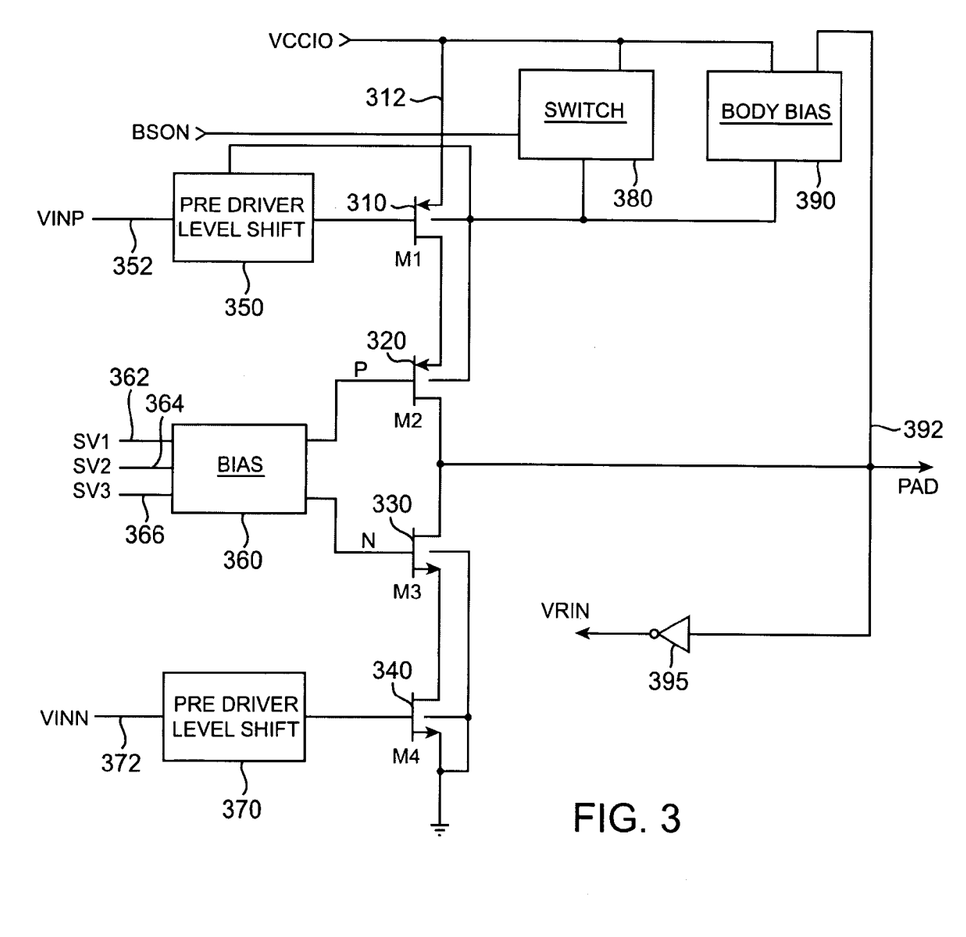
FIG. 3 is a simplified output driver consistent with an embodiment of the present invention.

FIG. 3 is a simplified output driver consistent with an embodiment of the present invention. Included are output driver devices M1 310 and M4 340, stacked devices M2 320 and M3 330, pre-driver and level shifters 350 and 370, stacked device bias circuits 360, body bias switch 380, body bias circuit 390, and input inverter or buffer 395. This figure, as with all the included figures, is included for exemplary purposes only, and does not limit either the possible embodiments of the present invention or the claims. Also, in this and the following figures, embodiments of the present invention are shown as being incorporated in CMOS circuits. In other embodiments of the present invention, other technologies, such as bipolar, HBTs, HFET, or other devices, technologies, and processes may be used.

There are at least 3 potential over-voltage situations that this I/O structure may encounter. The first is when VCCIO is lower than the voltage received at the pad on line 392. In that case, the source-to-bulk diode of device M2 320 can become forward biased such that current flows from the pad into the bulk of device M2 320. The second is when the VCCIO on line 312 is higher than the drain-to-source breakdown voltage of devices M1 310, M2 320, M3 330, or M4 340. The third is when the pad voltage on line 392 exceeds the drain-to-source breakdown voltage of device M3 330 or M4 340.

To protect the output structure in the first situation, where the pad voltage on line 392 is high enough to cause current conduction from the pad to the bulk of device M2 320, a body bias circuit 390 is used. This body bias circuit 390 tracks the higher of the supply VCCIO on line 312 or received voltage at the pad on line 392, and provides a bulk voltage for devices M1 310 and M2 320 such that drain-to-bulk conduction is avoided or limited. When the body bias circuit 390 is not needed, the body bias switch 380 shorts the bulk of devices M1 310 and M2 320 to the VCCIO voltage received on line 312.

The body bias circuit 390 also provides the supply voltage for the predriver level shift circuit 350. In this way, the higher voltage between the supply VCCIO on line 312 and the pad on line 392 is provided to the gate of M1 310, thus fully shutting off M1 310 such that it does not provide a current path when the output structure is tristated.

To protect the output structure in the second situation, where the VCCIO voltage on line 312 is higher than the drain-to-source breakdown voltages of devices M1 310, M2 320, M3 330, or M4 340, stacked devices M2 320 and M3 330 are used. Further, the bias voltages at their gates generated by the bias circuit 360 are such that the larger output voltage is properly allocated between the stacked and inverter devices, such that no device sees a voltage between any two of its terminals that is higher than the process breakdown voltage. This is done whether the output is an active output, or is tristated. The bias circuit 360 receives information, for example, on lines 362, 364, and 366, which determined the proper voltages for the gates of the stacked devices M2 320 and M3 330. These input signals may be generated by a circuit which compares the power supply voltage VCCIO on line 312 to a voltage, for instance a bandgap voltage, by programmable bits, or other methods or combination thereof. In this specific example, three control signals are shown as being received by the bias circuit 360 though in other embodiments of the present invention there may be one, two, or more than three signals, either analog or digital, received by the bias circuit 360.

Similarly, in the third situation, when the voltage received at the pad on line 392 is higher than the breakdown voltage of M4 340, the stacked device M3 330 is biased such that the received voltage is properly allocated between the stacked device M3 330 and the inverter device M4 340.

When the output structure provides an output voltage, a lower voltage signal associated with internal or core circuits is received by the pre-driver level shifters 350 and 370 on lines 352 and 372. The pre-driver and level shifters 350 and 370 translate the voltage swings from the core voltage range to an (typically) equal or higher voltage that is optimized to provide maximum drive without overstressing the oxides of M1 410 and M4 440. In each of the above cases, the input inverter 395 is typically biased by the lower core voltage since the inputs are simply the gates of MOS devices.

In this particular example, the circuit is an input/output circuit. In other embodiments of the present invention, this structure is simply an output circuit. These circuits may be tri-statable such that it may be coupled to a tri-state bus that is driven by other output structures, including those operating at higher voltages than VCCIO on line 392. When the output structure is coupled to a tri-state bus, the output is tri-stated when another output driver is driving the bus.

Figure 4:
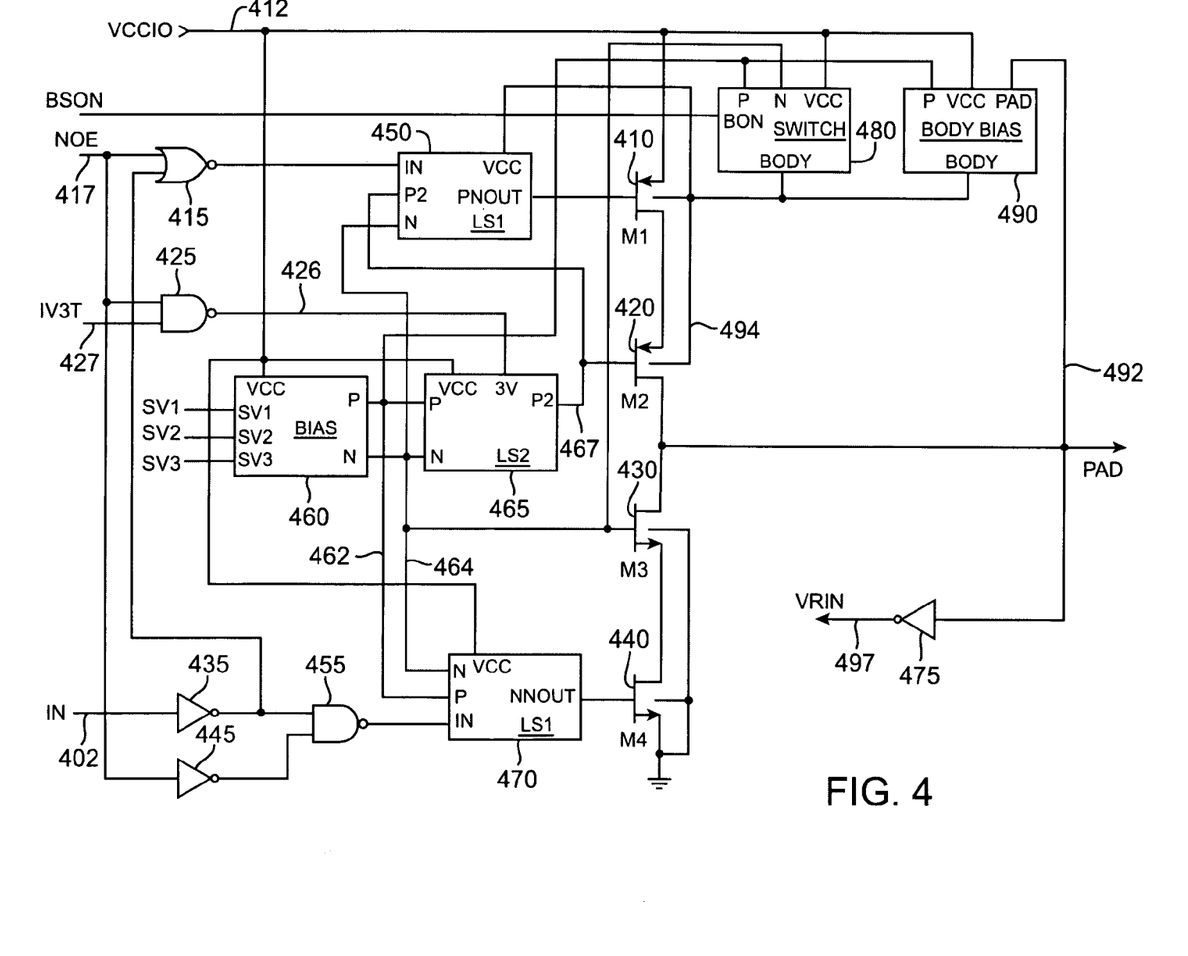
FIG. 4 is a more detailed block diagram of an input-output structure consistent with an embodiment of the present invention.

FIG. 4 is a more detailed block diagram of an input-output structure consistent with an embodiment of the present invention. Included are output inverter devices M1 410 and M4 440, stacked devices M2 420 and M3 430, bias circuit 460, level shifters 450, 465, and 470, body bias switch 480, bias circuits 490, inverter 495, logic gates 435, 455, and 415, and mode gate 425.

As before, this structure may be used as an output driver to buffer signals from the input line 402 to the output pad on line 492, or as in input to receive signals on the pad on line 492 and translate them to generate the signal VRIN on line 497. When this structure is used as an output, it may be either active or tri-stated. When it is an active output and the supply voltage VCCIO on line 412 exceeds the drain-to-source breakdown voltages for the output inverter devices M1 410 and M4 440, the stacked devices M2 420 and M3 430 are biased to stand off some of this excess supply voltage, thus protecting the output inverter devices M1 410 and M4 440. When this structure is tri-stated, for example when the pad on line 492 is connected to a tri-state bus, the output devices M1 410 and M4 440 are both off, thus providing a high impedance at the pad on line 492, and the stacked devices M2 420 and M3 430 are each biased to stand off a portion of the supply or received voltage, thus protecting each of the devices from an over-voltage condition.

In the output mode, a signal is received on line 402 by buffer 435. This buffer provides a signal to gates 455 and 415, which are gated by an output enable signal NOE on line 417. The output signals from these gates are received by the level shifters 450 and 470. The level shifters 450 and 470 translate voltages from the core voltage supply range to the output voltage supply range, which is adjusted to provide a large gate drive to M1 410 and M4 440 without stressing their gate oxides. Again, one or more control signals are received by the bias circuits 460, which generates bias voltages on lines 462 and 464. Another level shifter circuit 465 receive these bias signals, and additional information IV3T on line 427 and provides a bias to the gates of the stacked device M2 420. The body bias circuit 490 is not needed when the structure is used as an output so the body bias switch 480 line 494 to VCCIO on line 412.

When this I/O structure is used as an input, the output portion is tri-stated as above. When the input voltage received on line 492 is higher by a diode drop than VCCIO on line 412, the body bias circuit 490 prevents drain-to-bulk conduction in device M2 420. When the input voltage received on line 492 is higher than the drain-to-source breakdown voltage of device M4 440, the stacked device M3 430 is biased such that this voltage is divided between device M3 430 and M4 440, thus protecting the output inverter devices M4 440. In the input mode, the input signal is received at the pad on line 492 is translated by the buffer or input gate 495 to generate the signal VRIN on line 497. The body bias circuit 490 tracks the higher voltage between the received signal on line 492 and VCCIO on line 412 and provides a bias to the bulk of devices M1 410 and M2 420 and the other circuitry on line 494.

Figure 5:
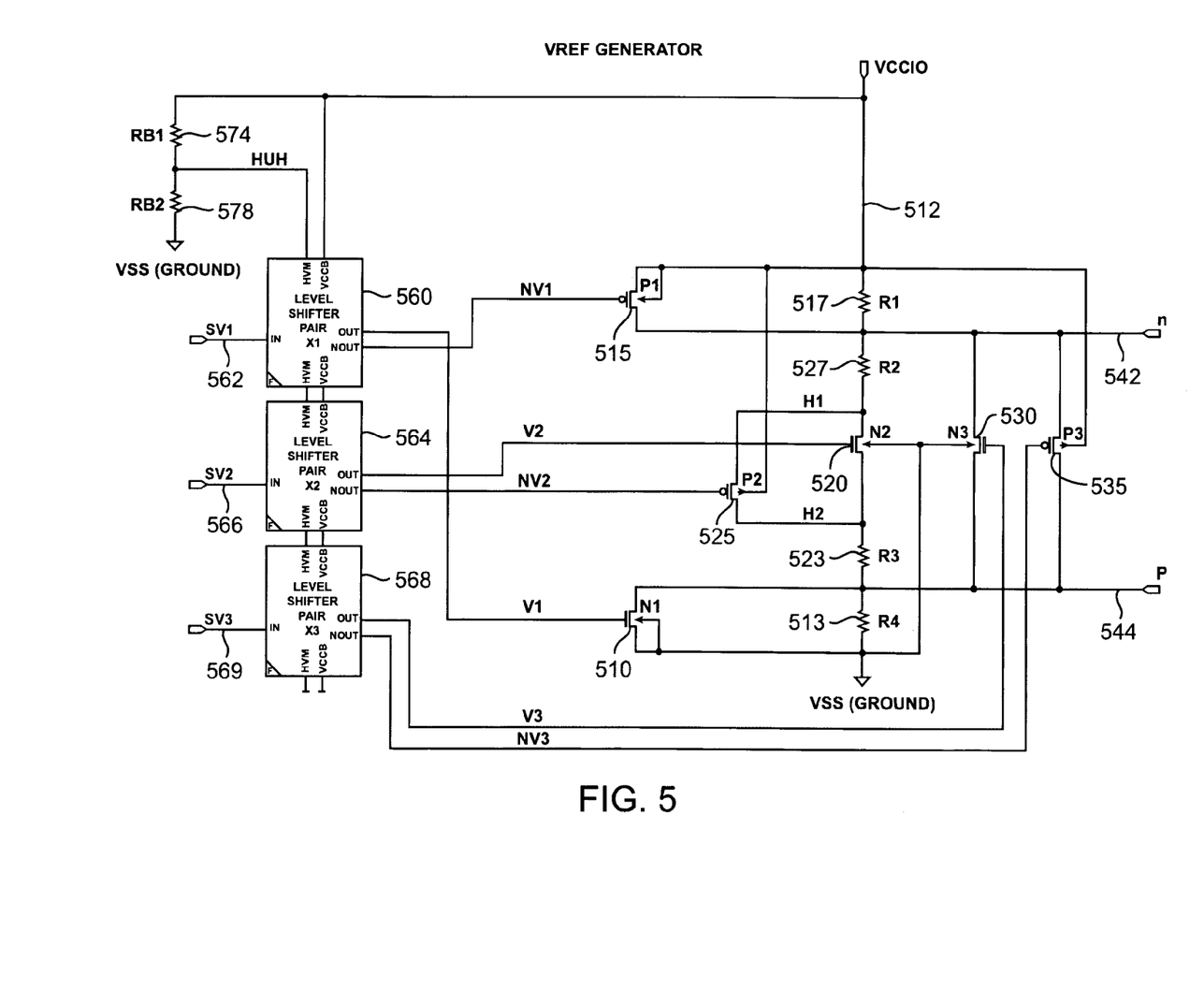
FIG. 5 is an example of a bias circuit that may be used as the bias circuits in FIG. 4 or as a bias circuit in other embodiments of the present invention.

FIG. 5 is an example of a bias circuit that may be used as the bias circuit 460 in FIG. 4 or as a bias circuit in other embodiments of the present invention. This bias circuit receives information, typically in the form of one or more bits of information, and generates a voltage N on line 542 and a voltage P on line 544. These output voltages connect to the gates of the stacked devices M2 420 and M3 430 in FIG. 4, either directly, through pass gates, or through a level shifter or buffer. It will be appreciated by one skilled in the art that variations on this bias circuit may be realized consistent with the present invention.

In this particular example, the voltages N on line 442 and P on line 544 each may be at one of three levels. Specifically, when the output structure in FIG. 4 is tri-stated, the stacked devices M2 520 and M3 430 are biased such that the stacked devices M2 520 and M3 430 and the output devices M1 410 and M4 440 are protected from over-voltages.

When the output structure in FIG. 4 is active, and VCCIO on line 512 increases above the drain-to-source breakdown voltage of the devices, the gates of the stacked devices M2 420 and M3 430 are adjusted such that they receive a portion of the output voltage across their drain-to-source. Specifically, as VCCIO on line 512 increases, N2 520 and P2 525 are on such that the voltages N 542 and P 544 are somewhere between the midpoint or one-half VCCIO and their respective supply rails. The exact voltages for N on line 542 and P on line 544 are determined by the values of R1 517, R2 527, R3 523, and R4 513. In a specific embodiment of the present invention, R1 517 is equal to R4 513, which in turn is equal to the sum of R2 527 and R3 523, while resistors R2 527 and R3 523 are equal. As VCCIO on line 512 increases further, the switches N3 530 and P3 535 are both on, and the voltages N on 542 and P 544 are equal and at the midpoint or one-half of VCCIO. In this specific example, as in the other examples, each resistor may either be a resistor, such as a poly or P-type resistor, or may alternately be a diode connected transistor or other appropriate structure. The level shift pairs 562, 564, and 568 receive bits that indicate which voltage range the device is operating in, and translates these bits from the core voltage range to the output voltage range defined by VCCIO on line 512 and ground. Also, the resistors may have different relative values, particularly if the n and p-channel devices have drain-to-source breakdown voltages that differ from each other by a significant amount.

A table summarizing the voltages N on line 542 and P on line 544 as a function VCCIO on line 512 is given below for this specific embodiment of the present invention. This table shows N and P when the I/O structure is an output. When the I/O structure is an input, N and P are biased to protect the output and stacked devices from receiving voltages higher than their process limits. In other embodiments of the present invention, there are only two states for N and P, that is, at their respective supply rails or at the midpoints or one-half of VCCIO. In other embodiment of the present invention, there may be more than 3 states, and these different number of states may be defined by various numbers of bits. In this way, the drive to the output device is maintained while protecting the devices from high voltages. In this specific embodiment of the present invention, the devices are thick oxide devices capable of withstanding 1.8 volts. In other embodiments, the devices may be used, and they may have other drain-source breakdown voltages.

| VCCIO | SV1 | SV2 | SV3 | N | P |
|---|---|---|---|---|---|
| 3.3 | low | low | high | 1.65 | 1.65 |
| 2.5 | low | high | low | 1.67 | 0.83 |
| 1.8 | high | low | low | 1.8 | 0 |
| 1.5 | high | low | low | 1.5 | 0 |

Figure 6:
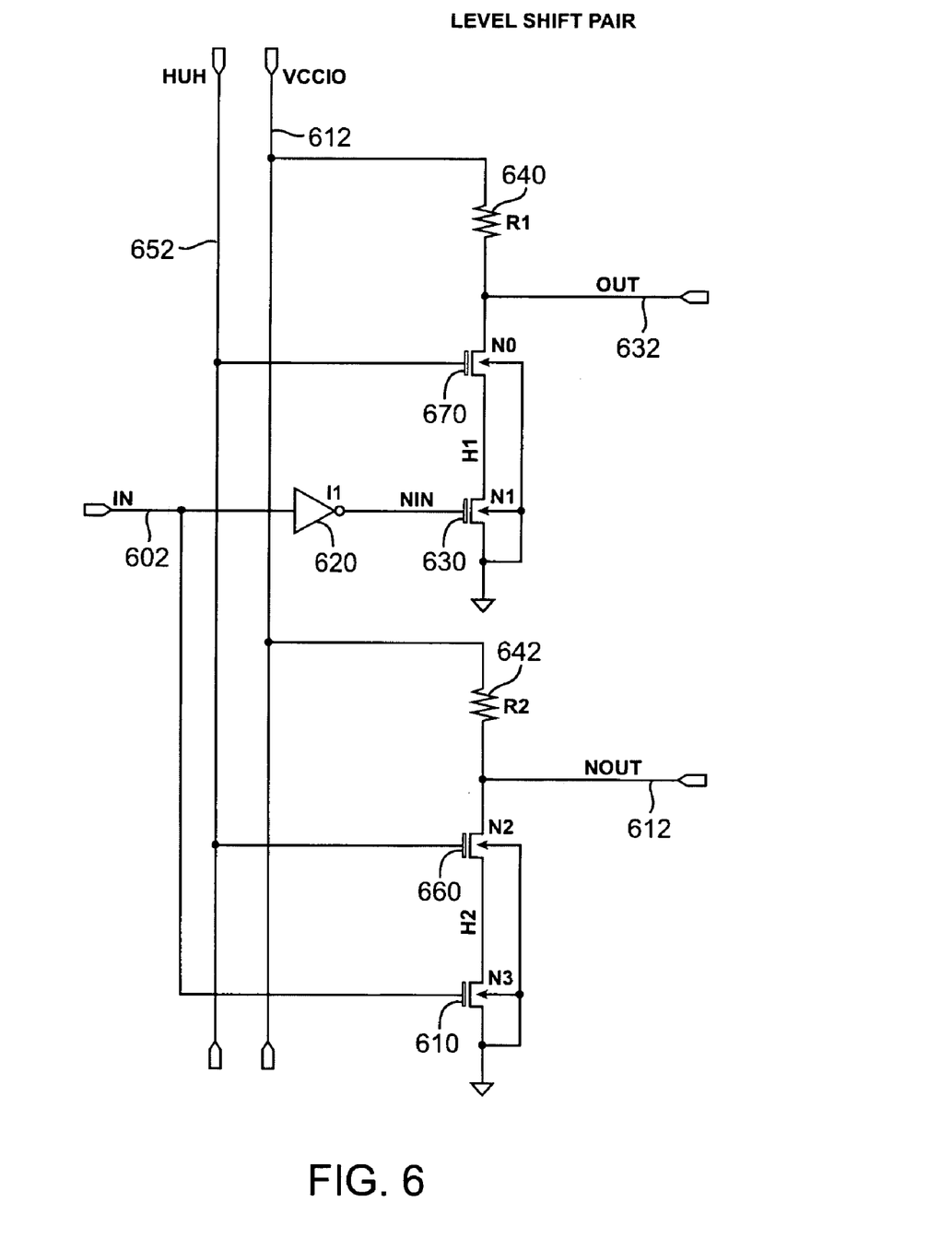
FIG. 6 is an exemplary level shift pair that may be used as the level shift pairs in FIG. 5, or as level shift pairs in other embodiments of the present invention.

FIG. 6 is an exemplary level shift pair that may be used as the level shift pairs 562, 564, and 568 in FIG. 5, or as level shift pairs in other embodiments of the present invention. An input signal is received on line 602 and is applied to the gates of N3 610. As the input voltage on line 602 is raised, device N3 610 pulls the output NOUT on line 612 to ground. Similarly, as the input voltage on line 602 increases, the output of inverter 620 is low, shutting off device N1 630 such that the output voltage on line 630 equals VCCIO on line 612.

As before, this and the other included resistors such as R1 640 and R2 642 may be formed of a resistive layer such as poly or p-type diffusion or implant, or they may be a diode connected transistor or other appropriate structure. If the resistors are poly, implant, well, or diffusion resistors, care should be taken that they do not see a voltage that is higher than their respective breakdown voltage. The inverter 620 is typically powered by the core voltage. The bias line HVH on line 652 is typically equal to one-half of the supply voltage VCCIO. In this way, the stacked devices N2 616 and N0 670 protect the inverter devices N1 630 and N3 610 from the full VCCIO voltage applied on line 612.

In a specific embodiment of the present invention, the voltage on line 652 is set by the values of RB1 574 and RB2 578, which are selected according to the following equation:

$$V_pT = VCCIO[RB2/(RB1+RB2)]$$

Where $V_pT$ = process target voltage for the drain-to-source breakdown voltage.

Figure 7:
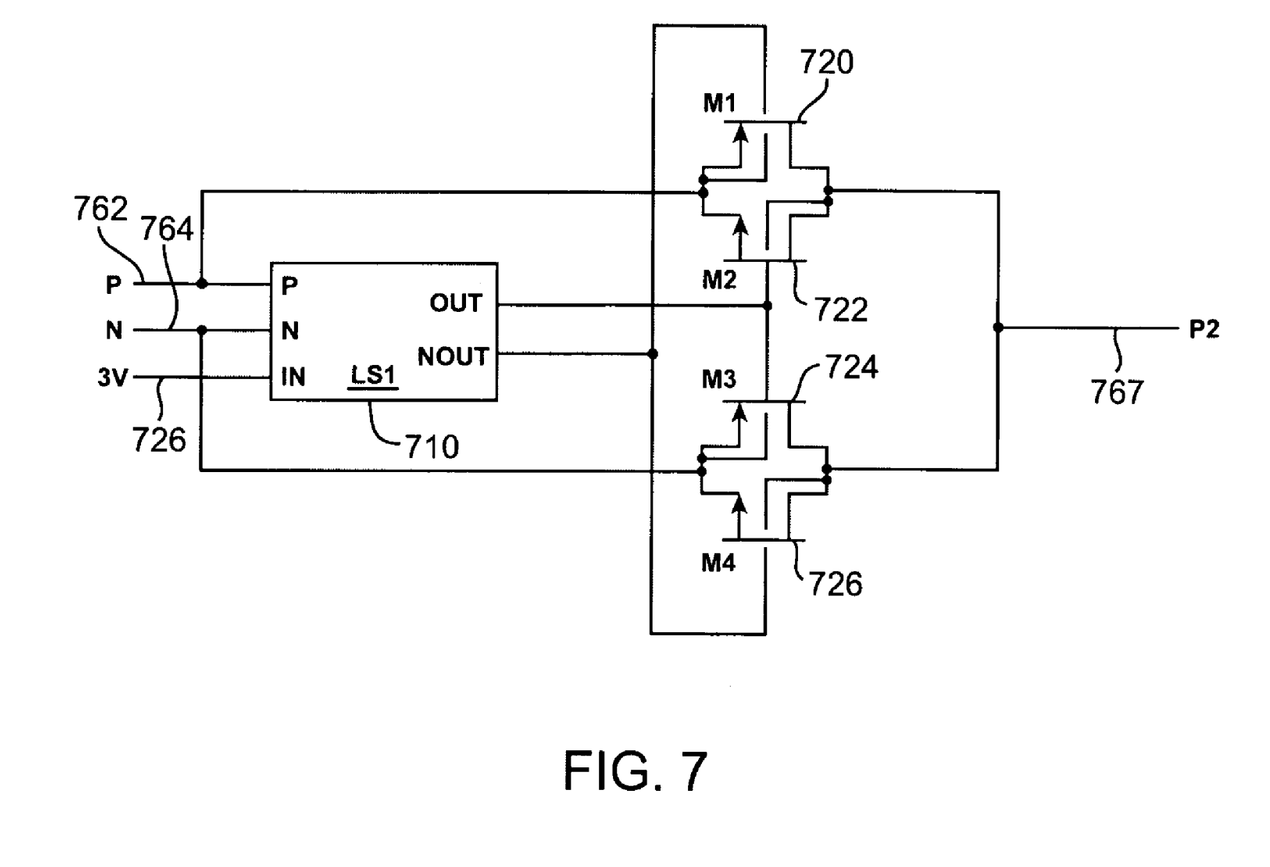
FIG. 7 is a schematic of a level shift circuit that may be used as the level shift circuit LS2 in FIG. 4 or as level shift circuits in other embodiments of the present invention.

FIG. 7 is a schematic of a level shift circuit that may be used as the level shift circuit LS2 465 in FIG. 4 or as a level shift circuit in other embodiments of the present invention. This circuit provides a selection mechanism such that either the voltage P on line 762 or N on line 764 is coupled to P2 on line 767. This line P2 767 drives the gate of M2 420 in FIG. 4. When the I/O structure in FIG. 4 is used as in input, and the received input voltage is higher than the supply voltage VCCIO, the gate of the stacked device M2 420 is coupled to N on line 764 through transistors M3 724 and M4 726. Under other conditions, that is when the structure is an output or an input that does not receive high voltages, P2 on line 767 is coupled to the bias voltage P on line 762 through devices M1 720 and M2 722.

Figure 8:
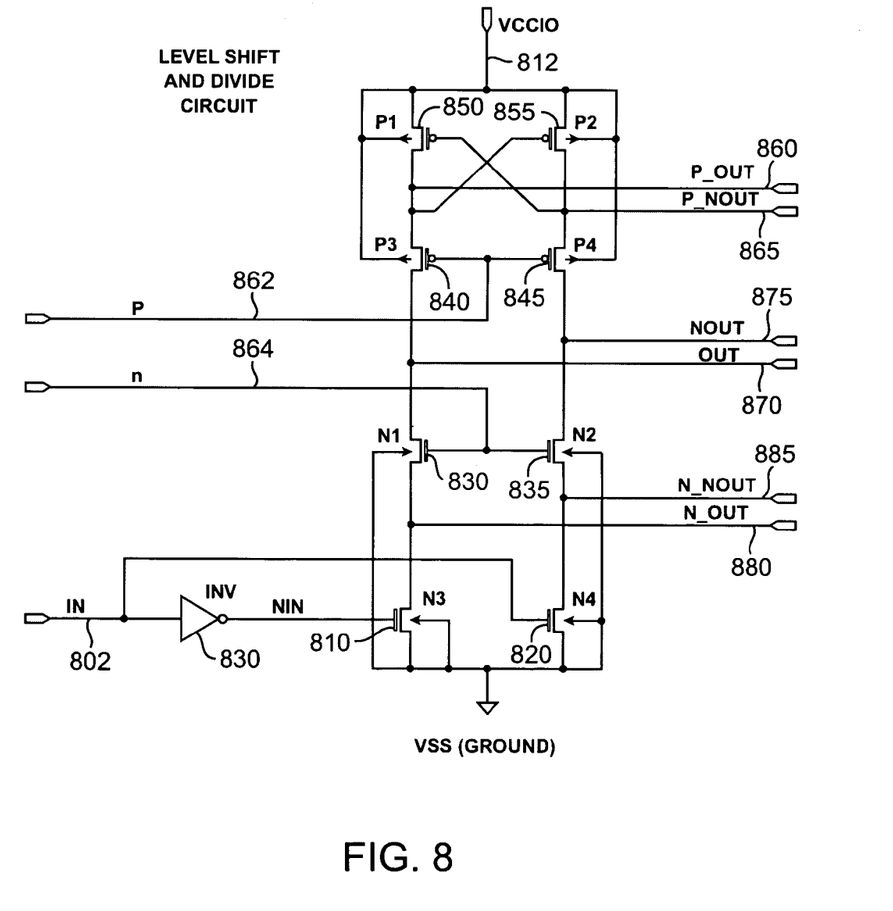
FIG. 8 is a schematic of the level shift circuit that may be used as the level shift circuit LS1 in FIG. 4 or FIG. 7, or as a level shifter circuit in other embodiments of the present invention.

FIG. 8 is a schematic of a level shift circuit that may be used as the level shift circuits LS1 450 and 470 in FIG. 4, or level shift circuit 710 in FIG. 7, or as a level shift circuit in other embodiments of the present invention. This circuit translates logic signals at the core voltage to the I/O voltage, while limiting voltage swings such that no devices connected to the output of the level shifter are exposed to voltages high than their drain-to-source breakdown voltage. The devices N3 810 and N4 820 are provided opposite phases of the input signal on line 802 by the inverter 830. The drains of N3 810 and N4 820 are coupled through the cascade devices N1 830, N2 835, P3 840, and P4 845 to the cross-coupled switches P1 850 and P2 855. When the input signal on line 802 is high, N4 820 conducts while N3 810 is off. Accordingly, the device P1 850 is on and conducting such that the voltage P_OUT on line 860 is high. Conversely, device P2 855 is off, and the voltage P_NOUT on line 865 drops to a threshold voltage above P on line 862. At the same time, the voltage NOUT on line 875 is pulled to ground, as is N_NOUT on line 885.

A table summarizing the voltage outputs as a function of input, supply, and bias voltages follows:

| IN | OUT | NOUT | P_OUT | P_NOUT | N_OUT | N_NOUT |
|---|---|---|---|---|---|---|
| low | 0 | VCCIO | P + $V_{TP}$ | VCCIO | 0 | N − $V_{TN}$ |
| high | VCCIO | 0 | VCCIO | P + $V_{TP}$ | N − $V_{TN}$ | 0 |

Where $V_{TP}$ and $V_{TN}$ are the magnitudes of the threshold voltages of P and N devices, respectively.

Figure 9:
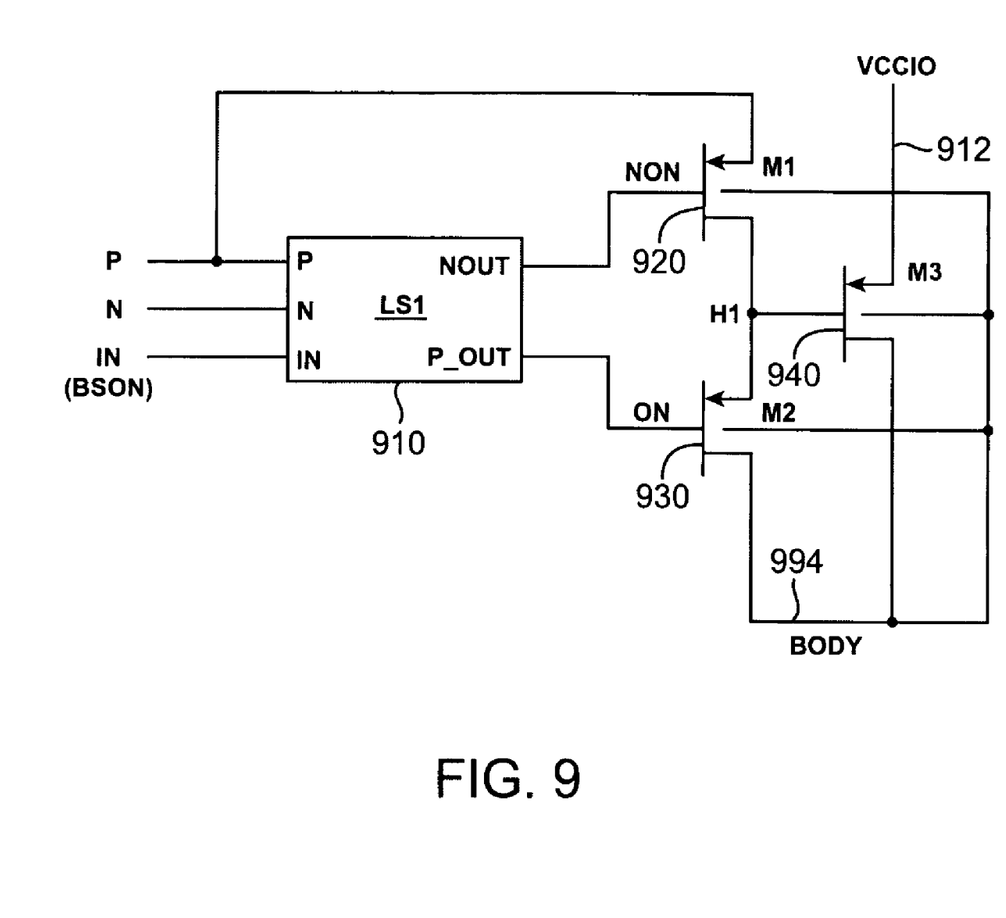
FIG. 9 is a schematic of a body bias switch that may be used as the body bias switch in FIG. 4 or as a body bias switch in other embodiments of the present invention.

FIG. 9 is a schematic of a body bias switch that may be used as the body bias switch 480 in FIG. 4 or as a body bias switch in other embodiments of the present invention. Included are level shift circuit 910, which may be the level shift circuit of FIG. 8, and transistor switches M1 920, M2 930, and M3 940. These transistors act to short the body of devices M1 410 and M2 420 and the other circuitry on line 494 in FIG. 4 to VCCIO when the structure of FIG. 4 is used as an output. When the structure of FIG. 4 is an input, the body bias circuit 490 sets the voltage of the buffer of devices M1 410 and M2 420. A table showing the voltages at various points in the switcher as a function of BSON is shown below. In short, when BSON is active high, the body connection is shorted to VCCIO. Typically, BSON is high when the I/O structure is in an output and is not subject to over-voltage conditions from another driver, for example on a tri-state bus.

| BSON | NON | ON | HI | BODY |
|---|---|---|---|---|
| low | VCCIO | P + $V_{TP}$ | BODY | open |
| high | 0 | VCCIO | P | VCCIO |

When the body connection is open, its voltage is determined by the body bias circuit.

Figure 10:
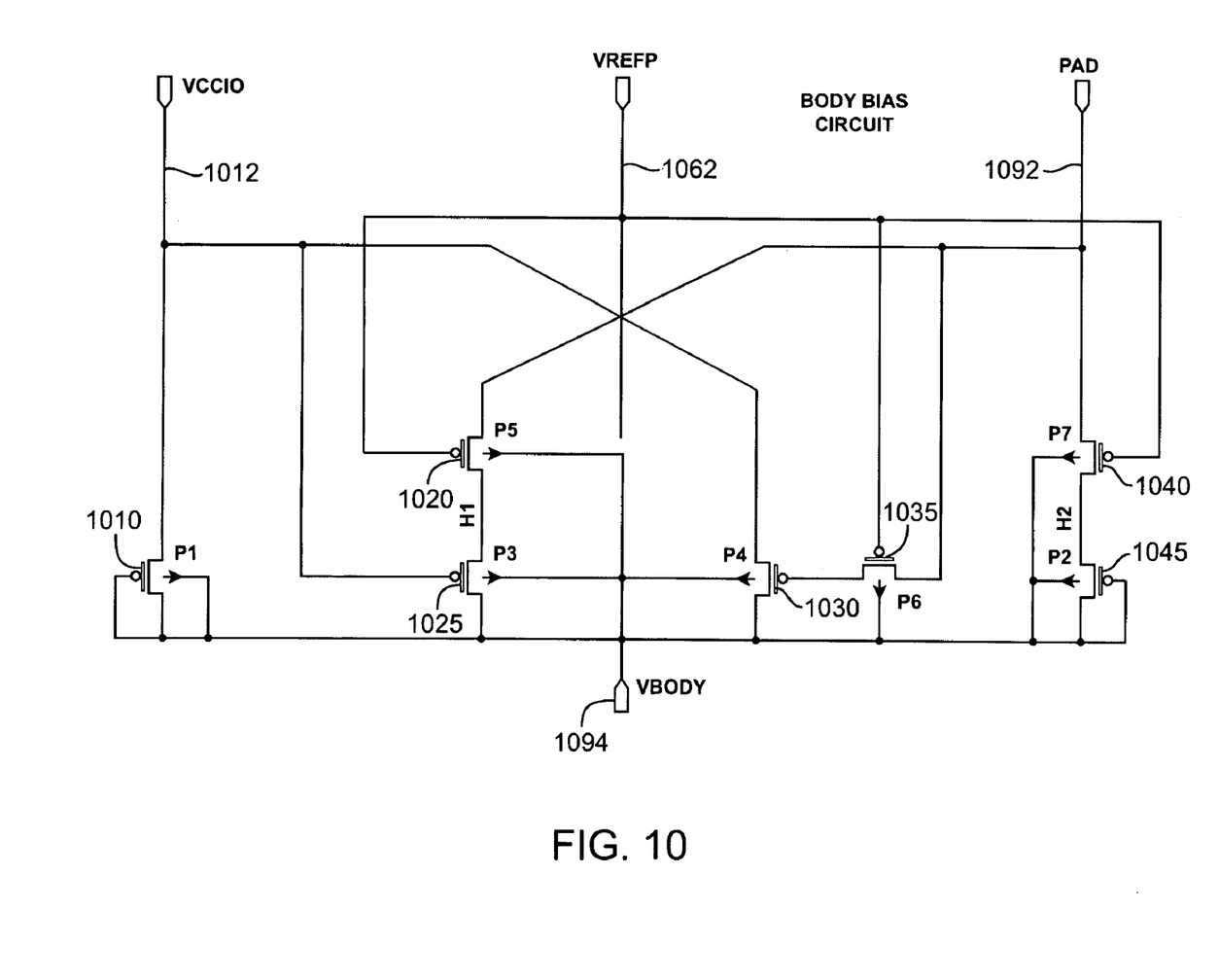
FIG. 10 is a schematic of a body bias circuit that may be used as the body bias circuit in FIG. 4 or as a body bias circuit in other embodiments of the present invention.

FIG. 10 is a schematic of a body bias circuit that may be used as the body bias circuit 490 in FIG. 4 or as a body bias circuit in other embodiments of the present invention. In summary, this circuit selects the higher of the voltages VCCIO on line 1012 or the pad on line 1092, and couples that voltage to the body bias line 1094. This body bias line 1094 is connected to the bulk of devices M1 410 and M2 420, as well as the level shift circuit LS1 450 in the circuit of FIG. 4.

Specifically, if VCCIO is higher than the pad voltage, the device P4 1030 shorts VCCIO on line 1012 to the body connection on line 1094. Conversely, if the pad voltage on line 1092 is higher than the VCCIO voltage on line 1012, transistor P3 1025 is on, and the pad on line 1092 is shorted to the body terminal 1094. The diode connected devices P1 1010 and P2 1045 provide a diode OR-type connection to the body 1094 for conditions where the pad voltage and supply voltage VCCIO are within a threshold voltage of each other. Also, these diodes are useful for biasing the body under transient conditions. Devices P5 1020, P6 1035, and P7 1040 provide high voltage protection from voltages on the pad on line 1092.

Figure 11:
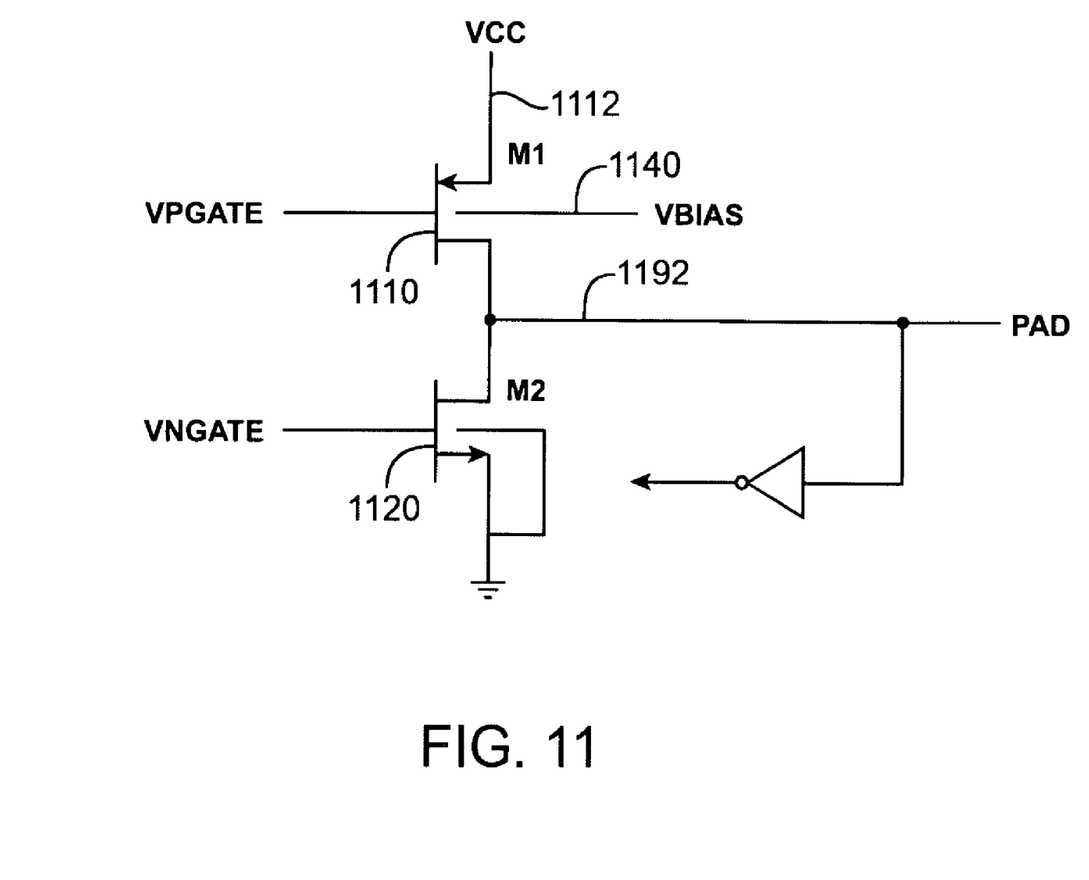
FIG. 11 is a schematic of an output inverter consistent with embodiment of the present invention.

FIG. 11 is a schematic of an output inverter consistent with embodiment of the present invention. Included are devices M 1110 and M2 1120. In this case, the bulk of transistor M1 1110 biased by a bias or supply voltage received at pad VBIAS on line 1140. In various embodiments of the present invention, a VBIAS pad may be used by a single output driver, or it may be shared by more than one output driver. By providing this VBIAS independent of other voltages on the chip, an output may be made resistant to drain-to-bulk conduction caused by high voltages at the pad on line 1192.

Specifically, if the bias voltage provided at VBIAS on line 1140 is V1, an input received voltage may be as high as V1 plus a diode drop before the parasitic drain-to-bulk diode of device M1 1110 begins to significantly conduct.

The above description of exemplary embodiments of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize the invention in various embodiments and with various modifications as are suited to the particular use contemplated.

What is claimed is:

1. An output stage comprising:
   a p-channel inverter device coupled to a first supply voltage;
   a p-channel stacked device coupled between the p-channel inverter and a pad;
   an n-channel stacked device coupled to the pad; and
   an n-channel inverter device coupled between the n-channel stacked device and a second supply voltage,
   wherein a gate of the p-channel stacked device receives a first bias voltage and a gate of the n-channel stacked device receives a second bias voltage, and the first bias voltage and the second bias voltage vary depending on a voltage difference between the first supply voltage and the second supply voltage, and when a difference between the first supply voltage and the second supply voltage exceeds a voltage threshold, the first bias voltage is greater than the second supply voltage and the second bias voltage is less than the first supply voltage.

2. The output stage of claim 1 further comprising:
   a first voltage translator coupled to a gate of the p-channel inverter device, wherein the first voltage translator translates a signal in a first voltage range to a second voltage range, the second voltage range defined by the first supply voltage and the second supply voltage.

3. The output stage of claim 2 further comprising:
   a second voltage translator coupled to a gate of the n-channel inverter device, wherein the second voltage translator translates a signal in the first voltage range to the second voltage range.

4. The output stage of claim 3 wherein the second supply voltage is ground.

5. The output stage of claim 1 wherein the output stage is tri-stated by setting the first bias voltage approximately equal to the first supply voltage and the second bias voltage approximately equal to the second supply voltage.

6. The output stage of claim 5 wherein when the voltage difference between the first supply voltage and the second supply voltage is approximately equal to the sum of the drain-to-source breakdown voltages for the p-channel and n-channel inverter devices, the first bias voltage and the second bias voltage are approximately equal and near the mid-point between the first supply voltage and the second supply voltage.

7. The output stage of claim 6 wherein the bulk of the p-channel stacked device is coupled to a body bias circuit, and
   wherein the body bias circuit generates a voltage that tracks the higher voltage between the first supply voltage and a received voltage.

8. An integrated circuit comprising:
   an input stage coupled to a pad;
   an output stage coupled to the pad; and
   a bias circuit coupled to the pad
   wherein the output stage comprises a first p-channel device coupled to the pad, the first p-channel device comprising a bulk, a drain, a gate, and a source, and the bulk is connected to the bias circuit, and
   wherein the gate of the first p-channel device receives a first bias voltage, and the first bias voltage is selected based on a supply voltage received by the output stage.

9. The integrated circuit of claim 8 wherein the output stage further comprises:
   a second p-channel device coupled to receive the supply voltage and further coupled to the first p-channel device.

10. The integrated circuit of claim 9 wherein the output stage further comprises:
    a first n-channel device coupled to the first p-channel device, the first n-channel device comprising a gate,
    wherein the gate of the first n-channel device receives a second bias voltage, and the second bias voltage is selected based on a supply voltage received by the output stage.

11. The integrated circuit of claim 9 further comprising:
    a first voltage translator coupled to a gate of the first p-channel device, wherein the first voltage translator translates a signal in a first voltage range to a second voltage range, the second voltage range defined by the first supply voltage and a second supply voltage, wherein the second supply voltage is ground.

12. An integrated circuit comprising:
    an input stage coupled to a pad;
    an output stage coupled to the pad and receiving a first power supply, and
    a bias circuit coupled between the pad and the output stage,
    wherein the output stage comprises a first p-channel device coupled to the pad, the first p-channel device comprising a bulk, a drain, a gate, and a source, the bulk connected to the bias circuit,
    wherein the bias circuit comprises a first device and a second device coupled in series between the pad and the bulk of the first p-channel device, and
    wherein a gate of the second device is coupled to the first power supply and a gate of the first device is coupled to a bias voltage, the bias voltage set to protect the first device from voltages on the pad.

13. The integrated circuit of claim 12 wherein the first device and the second device are p-channel devices.

14. The integrated circuit of claim 12 wherein the output stage further comprises:
    a second p-channel device coupled to receive the first supply voltage and further coupled to the first p-channel device, wherein the bulk of the first p-channel device is coupled to the bulk of the second p-channel device.

15. The integrated circuit of claim 14 further comprising:
    a first voltage translator coupled to a gate of the first p-channel device, wherein the first voltage translator translates a signal in a first voltage range to a second voltage range, the second voltage range defined by the first supply voltage and a second supply voltage, wherein the second supply voltage is ground.

16. The integrated circuit of claim 12 wherein the bias circuit provides a bias voltage to the bulk of the first p-channel device, and the bias voltage tracks the higher voltage between the first supply voltage and a voltage on the pad.

17. An integrated circuit comprising:
an input stage coupled to a pad;
an output stage coupled to the pad and receiving a first power supply; and
a bias circuit coupled between the pad and the output stage,
wherein the output stage comprises a first p-channel device coupled to the pad, the first p-channel device comprising a bulk a drain, a gate, and a source, and the bulk is connected to the bias circuit, and
wherein the bias circuit comprises a first device and a second device coupled in series between the pad and the bulk of the first p-channel device, the first device biased to protect the second device from voltages on the pad, and
wherein the first p-channel device receives a bias voltage at its gate, and the bias voltage is determined by the first supply voltage.

18. The integrated circuit of claim 17, wherein the integrated circuit is a programmable logic device.

19. An integrated circuit comprising an output buffer, the output buffer comprising:
a first pull-up device coupled to receive a first supply voltage;
a second pull-up device coupled between the first pull up device and a pad, and having a gate coupled to receive a first bias voltage;
a first pull-down device coupled to receive a second supply voltage;
a second pull-down device coupled between the first pull-down device and the pad, and having a gate coupled to receive a second bias voltage;
wherein when a difference between the first supply voltage and the second supply voltage is less than a first voltage threshold, the first bias voltage is approximately equal to the second supply voltage and the second bias voltage is approximately the first supply voltage, and
when the difference between the first supply voltage and the second supply voltage is greater than the first voltage threshold, the first bias voltage and the second bias voltage are each less than the first supply voltage and greater than the second supply voltage.

20. The integrated circuit of claim 19 wherein when the difference between the first supply voltage and the second supply voltage is greater than a second voltage threshold, the first bias voltage and the second bias voltage are approximately equal and midway between the first supply voltage and the second supply voltage.

21. The integrated circuit of claim 20 wherein when the difference between the first supply voltage and the second supply voltage is less than the second voltage threshold and greater than the first voltage threshold, the first bias voltage is between the second supply voltage and a voltage midway between the first supply voltage and the second supply voltage, and the second bias voltage is between the first supply voltage and a voltage midway between the first supply voltage and the second supply voltage.

* * * * *